United States Patent
Masleid et al.

(10) Patent No.: US 7,295,041 B1
(45) Date of Patent: *Nov. 13, 2007

(54) CIRCUITS AND METHODS FOR DETECTING AND ASSISTING WIRE TRANSITIONS

(75) Inventors: Robert Paul Masleid, Monte Sereno, CA (US); Andre Kowalczyk, San Jose, CA (US)

(73) Assignee: Transmeta Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/005,762

(22) Filed: Dec. 6, 2004

Related U.S. Application Data

(63) Continuation of application No. 10/879,807, filed on Jun. 28, 2004, which is a continuation-in-part of application No. 10/864,271, filed on Jun. 8, 2004.

(51) Int. Cl.
*H03K 19/0175* (2006.01)
*H03K 19/094* (2006.01)
(52) U.S. Cl. .............................. 326/86; 326/23; 326/27
(58) Field of Classification Search .................. 326/86, 326/83, 23, 27; 327/112, 17
See application file for complete search history.

(56) References Cited

U.S. PATENT DOCUMENTS

| | | | |
|---|---|---|---|
| 4,498,021 A * | 2/1985 | Uya | 326/86 |
| 5,166,555 A * | 11/1992 | Kano | 326/87 |
| 5,414,312 A | 5/1995 | Wong et al. | |
| 5,455,521 A | 10/1995 | Dobbelaere | |
| 5,497,105 A | 3/1996 | Oh et al. | |
| 5,739,715 A | 4/1998 | Rawson | |
| 5,767,700 A * | 6/1998 | Lee | 326/86 |
| 5,969,543 A | 10/1999 | Erickson et al. | |
| 6,025,738 A | 2/2000 | Masleid | |
| 6,114,840 A | 9/2000 | Farrell et al. | |
| 6,172,545 B1 | 1/2001 | Ishii | |
| 6,262,601 B1 | 7/2001 | Choe et al. | |
| 6,281,706 B1 | 8/2001 | Wert et al. | |
| 6,321,282 B1 | 11/2001 | Horowitz et al. | |
| 6,573,777 B2 | 6/2003 | Saint-Laurent et al. | |
| 6,577,176 B1 | 6/2003 | Masleid et al. | |

(Continued)

OTHER PUBLICATIONS

Iima, et al., Capacitance Coupling Immune, Transient Sensitive Accelerator for Resistive Interconnect Signals of Subquarter Micron ULSI, Apr. 1996, IEEE Journal of Solid-State Circuits, vol. 31, No. 4.

Nalamalpu, et al., Boosters for Driving Long Onchip Interconnects-Design Issues, Interconnect Synthesis, and Comparison with Repeaters, Jan. 2002, IEEE Transactions on Computer-Aided Design of Integrated Circuits and Systems, vol. 21, No. 1.

*Primary Examiner*—Daniel Chang

(57) ABSTRACT

A circuit for assisting signal transitions on a wire, and a method thereof. The circuit includes a first subcircuit that causes a first transistor that is coupled to the circuit's output to turn on during a rising transition and then turn off. The first transistor drives the output to a high state to assist in the rising transition. The circuit also includes a second subcircuit that causes a second transistor that is coupled to the circuit's output to turn on during a falling transition and then turn off. The second transistor drives the output to a low state to assist in the falling transition.

20 Claims, 6 Drawing Sheets

U.S. PATENT DOCUMENTS

| | | |
|---|---|---|
| 6,731,140 B2 | 5/2004 | Masleid et al. |
| 2001/0030561 A1 | 10/2001 | Asano et al. |
| 2002/0056016 A1 | 5/2002 | Horowitz et al. |
| 2003/0057775 A1 | 3/2003 | Yamashita et al. |
| 2003/0160630 A1 | 8/2003 | Adrian |
| 2003/0231713 A1 | 12/2003 | Masleid et al. |

* cited by examiner

CIRCUITS AND METHODS FOR DETECTING AND ASSISTING WIRE TRANSITIONS

RELATED UNITED STATES PATENT APPLICATIONS

This application is a Continuation application of the co-pending, commonly-owned U.S. patent application Ser. No. 10/879,807, filed Jun. 28, 2004, by R. Masleid et al., and entitled "Circuits and Methods for Detecting and Assisting Wire Transitions," which is a Continuation-in-Part of U.S. patent application Ser. No. 10/864,271 by R. Masleid et al., filed on Jun. 8, 2004, entitled "Stacked Inverter Delay Chain,", assigned to the assignee of the present invention, and hereby incorporated by reference in its entirety.

This application is related to U.S. patent application Ser. No. 10/879,808 by R. Masleid et al., filed on Jun. 28, 2004, entitled "Repeater Circuit Having Different Operating and Reset Voltage Ranges, and Methods Thereof,", assigned to the assignee of the present invention, and hereby incorporated by reference in its entirety.

This application is related to U.S. patent application Ser. No. 10/879,879 by R. Masleid et al., filed on Jun. 28, 2004, entitled "Repeater Circuit with High Performance Repeater Mode and Normal Repeater Mode,", assigned to the assignee of the present invention, and hereby incorporated by reference in its entirety.

This application is related to U.S. patent application Ser. No. 10/879,645 by R. Masleid et al., filed on Jun. 28, 2004, entitled "Repeater Circuit with High Performance Repeater Mode and Normal Repeater Mode, Wherein High Performance Repeater Mode Has Fast Reset Capability,", assigned to the assignee of the present invention, and hereby incorporated by reference in its entirety.

BACKGROUND OF THE INVENTION

1. Field of the Invention

Embodiments of the present invention relate to wire repeaters, and in particular to wire accelerators.

2. Related Art

A vital area of circuit performance is the propagation time of signals across a chip. Longer wires in chips resist the propagation of signals due to the resistance and capacitance of the wire. The propagation of signals across a chip can be improved by inserting an amplification circuit—sometimes referred to as buffering or repeater insertion—into the wire.

A wire accelerator is a type of wire repeater. A wire accelerator is intended to detect a transition in a wire and then help the transition. A problem with conventional wire accelerators is that, after helping achieve one transition, they continue to drive the wire and so resist the next transition.

SUMMARY OF THE INVENTION

Therefore, a wire accelerator that can both drive a wire and assist during wire transitions, without resisting the transitions, would be valuable. Embodiments in accordance with the present invention provide such a wire accelerator.

BRIEF DESCRIPTION OF THE DRAWINGS

The accompanying drawings, which are incorporated in and form a part of this specification, illustrate embodiments of the present invention and, together with the description, serve to explain the principles of the invention. The drawings referred to in this description should not be understood as being drawn to scale except if specifically noted.

DETAILED DESCRIPTION OF THE INVENTION

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

Figure 1:
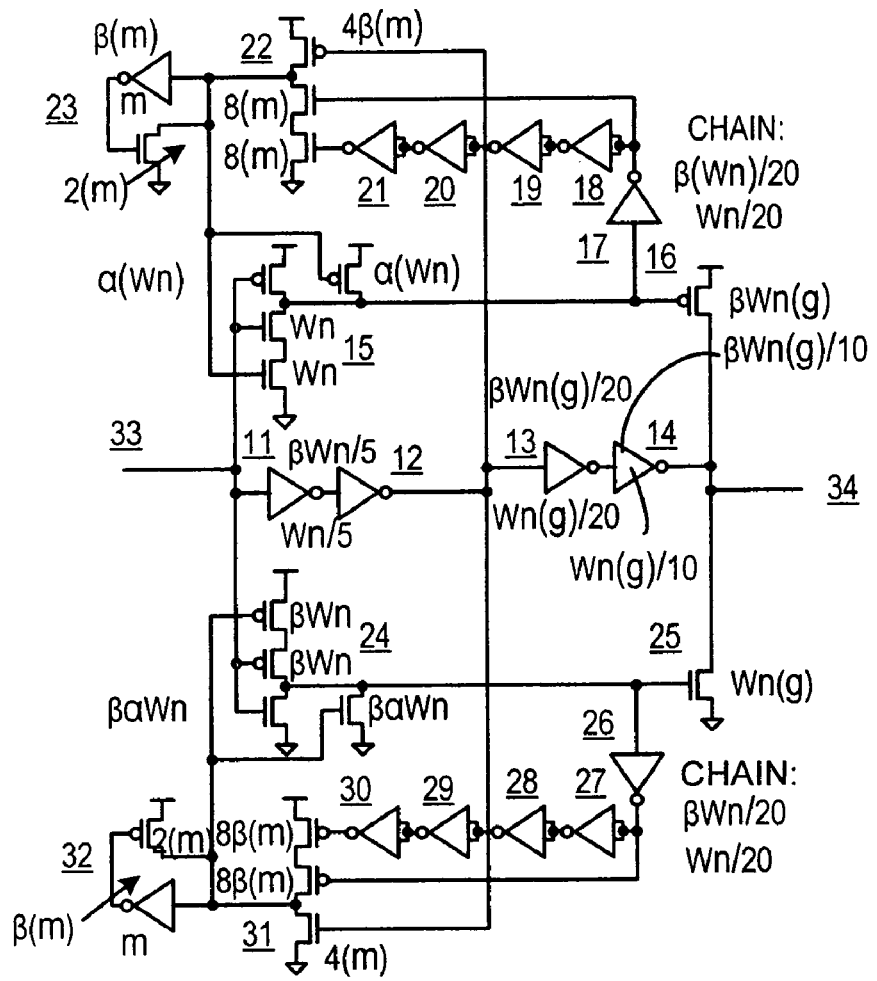
FIG. 1 illustrates a schematic of one embodiment of a circuit for assisting signal transitions in accordance with the present invention.

FIG. 1 illustrates a schematic of one embodiment of a circuit 10 for driving signals on a wire and for assisting signal transitions in accordance with the present invention. Circuit 10 can be coupled to the wire to function as a wire repeater or accelerator. As will be seen, circuit 10 provides the capability to detect a transition (e.g., a rising transition or falling transition) occurring on the wire and assist the transition, and then drive the wire after the transition without resisting a subsequent transition.

In the embodiment of FIG. 1, circuit 10 has an input node 33 and an output node 34 that are each coupled to the wire (specifically, a first part of the wire is connected to input node 33, and a second part of the wire is connected at output node 34). In an alternative embodiment, circuit 10 can be implemented in a lookaside configuration, in which the input node is connected to the output node, and together the input and output nodes are connected to the wire. Lookaside configurations are illustrated as circuits 35 and 36 in FIGS. 2 and 3, respectively.

In general, circuit 10 of FIG. 1 includes three subcircuits referred to herein as keeper circuitry, rising transition circuitry, and falling transition circuitry. In the example of FIG. 1, the keeper circuitry includes a delay chain consisting of gates (inverters) 11, 12, 13 and 14 coupled between the input node 33 and the output node 34.

In the present embodiment, the rising transition circuitry includes NAND gate 15, a delay chain consisting of inverter 17 and stacked inverters 18, 19, 20 and 21 (stacked inverters are described further in conjunction with FIG. 4 below); pseudo-inverter 22; and half latch 23. The rising detection circuitry drives an output transistor 16. In one embodiment, transistor 16 is a p-type device (e.g., a positive channel metal oxide semiconductor field effect transistor, or pFET).

Continuing with reference to FIG. 1, the falling transition circuitry includes NOR gate 24; a delay chain consisting of inverter 26 and stacked inverters 27, 28, 29 and 30; pseudo-inverter 31; and half latch 32. The falling detection circuitry drives an output transistor 25. In one embodiment, transistor is an n-type device (e.g., a negative channel metal oxide semiconductor field effect transistor, or nFET).

Circuit 10 will be described in operation. From that discussion, it will be understood that the keeper circuitry, rising transition circuitry and falling transition circuitry are not limited to the elements illustrated and described by the example of FIG. 1. For example, half latches 23 and 32 can be replaced with full latches. Also, for example, the number of inverters in the delay chains can be different than that shown in the example of FIG. 1.

In general, the rising transition circuitry generates a pulse in response to receiving a rising input at input node 33 (in other words, upon detecting a rising transition, e.g., a rising edge, in a signal on a wire). The pulse operates the output transistor 16 for a period of time. Afterwards, the transistor 16 is shut off. While turned on, the transistor 16 drives the output node 34 to a high state.

In a similar manner, the falling transition circuitry generates a pulse in response to receiving a falling input at input node 33 (in other words, upon detecting a falling transition, e.g., a falling edge, in a signal on a wire). The pulse operates the output transistor 25 for a period of time. Afterwards, the transistor 25 is shut off. While turned on, the transistor 25 drives the output node 34 to a low state.

The keeper circuitry operates at a reduced drive strength relative to the rising and falling transition circuitry. The keeper circuitry maintains the state at the output node 34 in between operation of the transistors 16 and 25. That is, the keeper circuitry maintains a high state at output node 34 after transistor 16 is shut off (and before transistor 25 is turned on), and also maintains a low state at output node 34 after transistor 25 is turned off (and before transistor 16 is turned on).

More specifically, circuit 10 operates as follows. A rising input (a rising edge) at input node 33 causes the NAND gate 15 to fall, which activates the output transistor 16 and drives the output node 34 high. The fall of the NAND gate 15 also starts the delay chain in the rising transition circuitry (inverter 17, stacked inverters 18–21 and pseudo-inverter 22). The delay chain in the keeper circuitry (specifically, inverters 11–12) rises, drives half latch 32 low, and resets the falling transition circuitry. The NAND gate 15 then rises (after a period of time established by the delay chain in the rising transition circuitry), which deactivates the transistor 16. The rise of NAND gate 15 also releases half latch 23 so that it can be reset during a falling transition. After transistor 16 is shut off, the keeper circuitry keeps output node 34 high, until a falling transition is detected.

A falling input (a falling edge) at input node 33 causes the NOR gate 24 to rise, which activates the output transistor 25 and drives the output node 34 low. The rise of the NOR gate 24 also starts the delay chain in the falling transition circuitry (inverter 26, stacked inverters 27–30 and pseudo-inverter 31). The delay chain in the keeper circuitry (specifically, inverters 11–12) falls, drives half latch 23 high, and resets the rising transition circuitry. The NOR gate 24 then falls (after a period of time established by the delay chain in the falling transition circuitry), which deactivates the transistor 25. The fall of NOR gate 24 also releases half latch 32 so that it can be reset during a rising transition. After transistor 25 is shut off, the keeper circuitry keeps output node 34 low, until a rising transition is detected.

Thus, circuit 10 provides complementary edge detectors: the NAND gate and delay chain of the rising transition circuitry, and the NOR gate and delay chain of the falling transition circuitry. The rising transition resets the falling transition circuitry, and the falling transition resets the rising transition circuitry, while the keeper circuitry in effect acts as memory to retain the current state of the overall circuit.

Circuit 10 is in effect a four-state driver: 1) at a rising transition, an internal pulse is generated and the state is driven high with a low impedance output transistor ("hard drive high"), assisting the rising transition; 2) followed by a higher impedance keep state which maintains the high state and helps drive the high signal on the wire; 3) followed by the state being driven low with a low impedance output transistor ("hard drive low"), assisting the falling transition; and 4) followed by another higher impedance keep state that maintains the low state and helps drive the low signal on the wire.

In FIG. 1, 'Wn' refers to the depletion layer width, and 'm' refers to the minimum device size (width). Different values of Wn are contemplated, and device widths are generally proportional to Wn. If a value of Wn results in a device width less than the minimum, the device width is clamped at the minimum. In the stacked inverters 18–21 and 27–30, there may be both p-type devices and n-type devices (see FIG. 4); hence, in FIG. 1, two sets of dimensions are shown for the elements of the delay chains (one for p-type devices, and one for n-type devices).

In one embodiment, the gate width-to-length ratio ($\beta$) is 1.7 (the basic strength ratio of P to N), the scaling factor ($\alpha$) is $\frac{1}{6}$ (the beta skew factor for skewed stages), and the transconductance (g) is 8 (the gain ratio between internal stages). Such values are exemplary; the present invention is not so limited.

However, and importantly, dimensions are selected so that the keeper circuitry does not interfere with a transition. That is, the keeper circuitry can maintain the state at the output node 34, but is weak enough so that it can be overcome by a wire transition. The transistors 16 and 25 are turned off between transitions, so the rising transition circuitry and falling transition circuitry also do not interfere with a transition.

Figure 2:
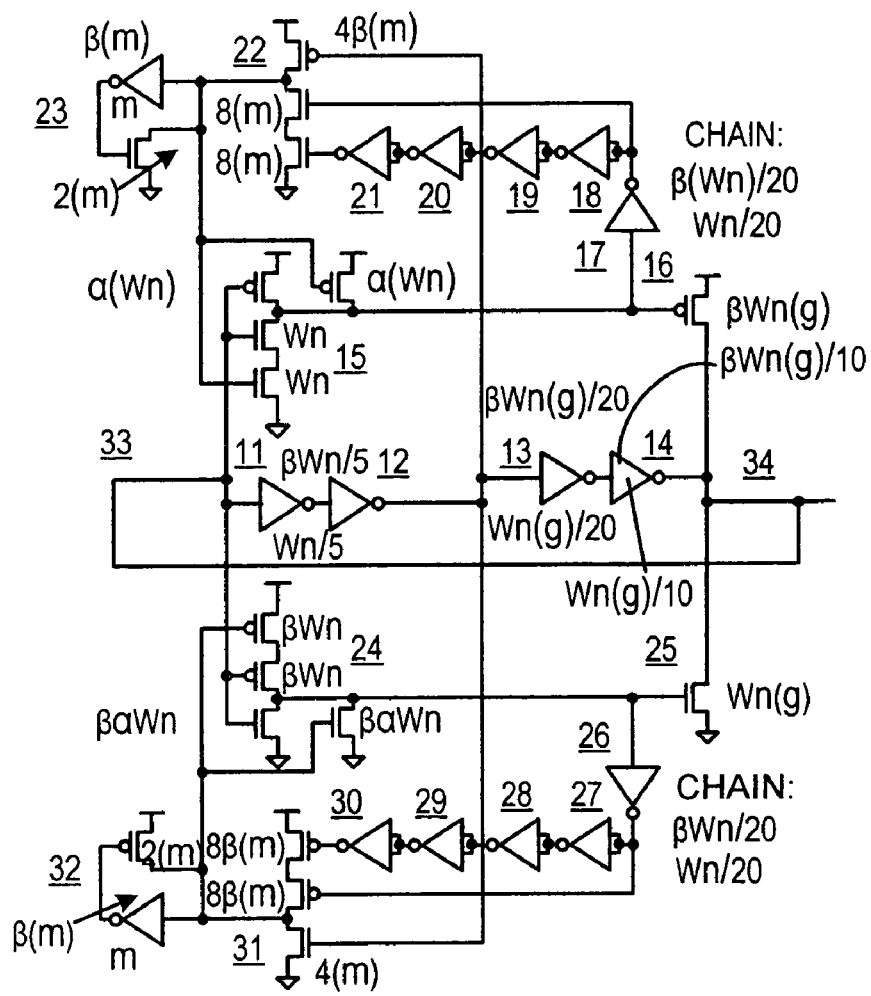
FIG. 2 illustrates a schematic of another embodiment of a circuit for assisting signal transitions in accordance with the present invention.

FIG. 2 illustrates a schematic of an embodiment of a circuit 35 for driving wire signals and assisting signal transitions in accordance with the present invention. Circuit 35 differs from circuit 10 of FIG. 1 in that the input node 33 and output node 34 of circuit 35 are connected to each other in a lookaside configuration. Elements common to circuits 10 and 35 are numbered the same. Circuit 36 can be implemented as a lookaside wire repeater or accelerator when coupled to a wire on a chip, functioning in a manner similar to circuit 10.

Figure 3:
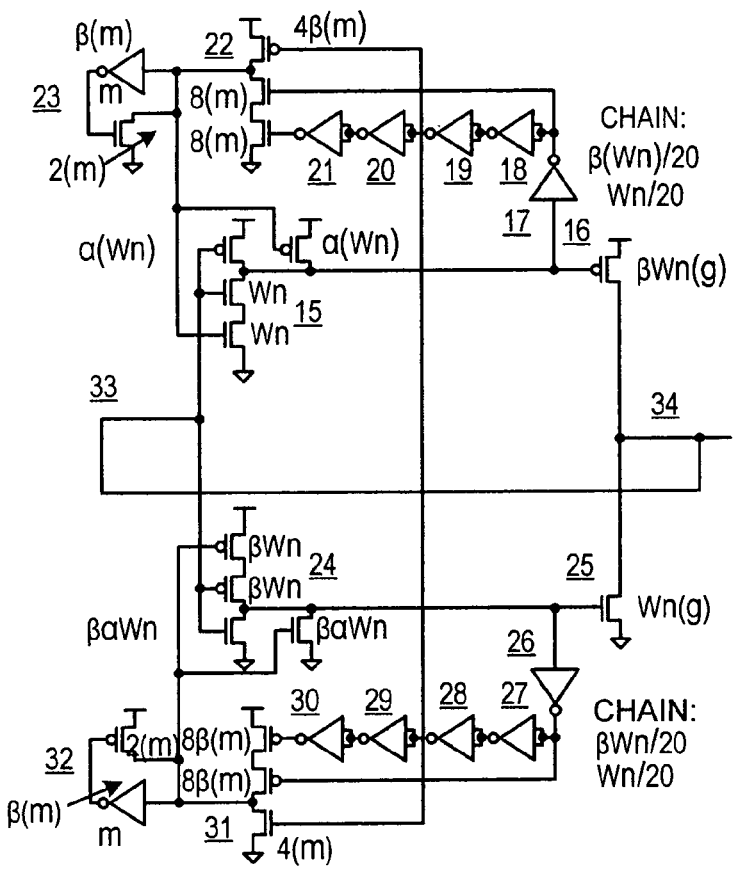
FIG. 3 illustrates a schematic of yet another embodiment of a circuit for assisting signal transitions in accordance with the present invention.

FIG. 3 illustrates a schematic of an embodiment of a circuit 36 for assisting signal transitions in accordance with the present invention. Circuit 36 differs from circuit 35 of FIG. 2 in that circuit 36 does not include keeper circuitry (e.g., inverters 11–14 of circuit 35 are not present in circuit 36). Elements common to circuits 35 and 36 are numbered the same. Circuit 36 can be implemented as a lookaside wire repeater when coupled to a wire on a chip, functioning in a manner similar to circuit 35 except for maintaining state at the output node between rising and falling transitions. In a similar manner, the keeper circuitry may not be included in circuit 10 of FIG. 1.

Figure 4:
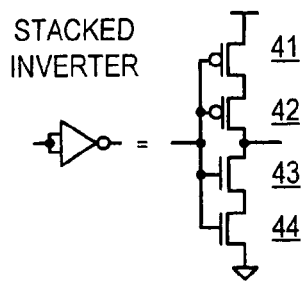
FIG. 4 illustrates a schematic of one embodiment of a stacked inverter in accordance with the present invention.

FIG. 4 illustrates a schematic of one embodiment of a stacked inverter 40 in accordance with the present invention. In contrast to a conventional inverter, stacked inverter 40 includes more than a single p-type device coupled to a single n-type device. Rather, stacked inverter 40 includes multiple p-type devices and multiple n-type devices. In the example of FIG. 4, stacked inverter 40 includes two p-type devices 41 and 42, and two n-type devices 43 and 44; however, the present invention is not limited to either that combination of devices or that number of devices. The gates of the p-type and n-type devices are coupled to form the input of stacked inverter 40.

The p-type devices are configured to pull the output high (when appropriate) and the n-type devices are configured to pull the output low. Consequently, the drive capability of stacked inverter 40 is less than the drive capability of a conventional inverter. Beneficially, such decreased drive capability produces an increased delay of a signal through stacked inverter 40. Additionally, stacked inverter 40 presents an increased load to its driving circuitry in comparison to a conventional inverter. For example, a signal input to stacked inverter 40 is coupled to four active devices as opposed to being coupled to two active devices in a conventional inverter. Each device presents an input capacitance. Such increased loading produces a further desirable increase in signal propagation delay.

The output of stacked inverter 40 can be coupled to the input of another stacked inverter, as in the circuits of FIGS. 1–3, to achieve larger signal delay values. In the example of FIG. 4, the output is taken at the coupling of a p-type device to an n-type device.

Figure 5:
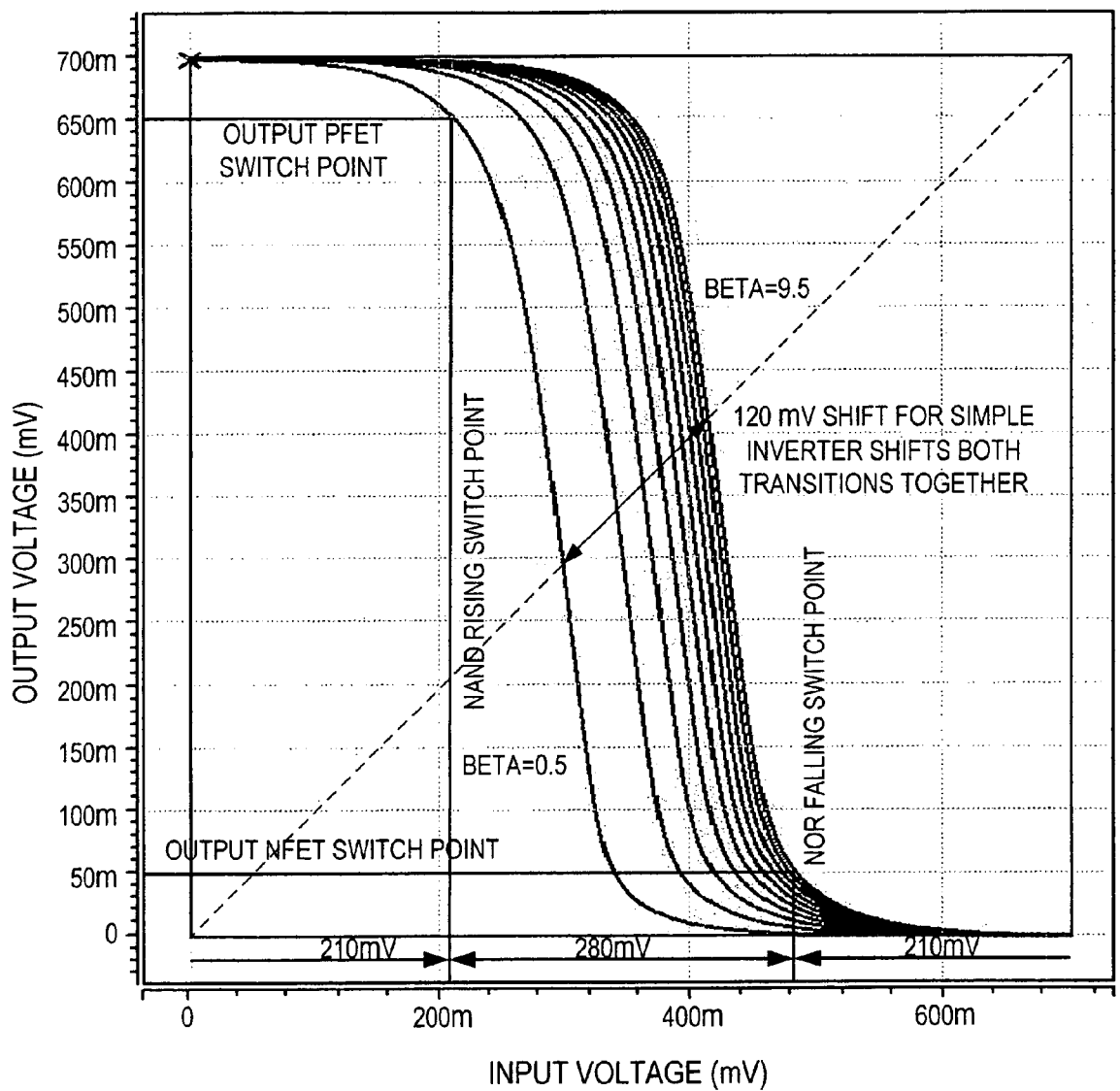
FIG. 5 is a curve of inverter voltage in versus voltage out in accordance with embodiments of the present invention.

FIG. 5 is an exemplary inverter transfer curve for a 700 millivolt (mV) power supply (Vdd) showing voltage in versus voltage out for various values of β in accordance with embodiments of the present invention. FIG. 5 illustrates that, for small voltage shifts on the input, there is no response on the output until the mid-range of the voltage is reached, at which point a relatively large shift is realized. Ordinarily, for static circuits, the input switch point is defined as the point where the input voltage equals the output voltage, so that the switching point shifts only a little as a function of β. However, referring also to FIGS. 1–3, the NAND gate 15 and the NOR gate 24 are only driving individual transistors (transistors 16 and 25, respectively), and therefore it is not necessary for the output voltages of the logic gates 15 and 24 to reach their respective input voltages in order for circuits 10, 35 or 36 to function. Instead, the logic gates 15 and 24 only need to drive to the switch points (the threshold voltages) of the respective output transistors 16 and 25.

Looking at FIG. 5, with reference also to FIGS. 1–3, the output pFET switch point (e.g., transistor 16) is approximately 50 mV below Vdd. For the curve of β equal to 0.5, this reduces the rising switch point of the NAND gate 15 by about 140 mV from Vdd/2, to about 210 mV. The output nFET switch point (e.g., transistor 25) and the falling switch point of the NOR gate 24 are affected in a similar manner with β equal to 9.5.

Thus, for an output pFET, the input voltage switch point moves approximately 140 mV in the advantageous direction (that is, down) from Vdd/2 for a 700 mV power supply. Similarly, for an output nFET, the input voltage switch point moves approximately 140 mV up from Vdd/2 for a 700 mV power supply. Consequently, the input switching point is approximately one-third and two-thirds of Vdd for a pFET output and an nFET output, respectively. Thus, the switch points are advantageously moved a relatively far distance apart from each other. Another advantage is that a reduced portion of a transition (rising or falling) is required in order for circuits 10, 35 and 36 (FIGS. 1–3) to operate. That is, the logic gates 15 and 24 will operate at lower voltages, and so the circuits 10, 35 and 36 will detect a transition earlier and thus can assist the transition earlier.

To summarize, with any of the circuits 10, 35 and 36 of FIGS. 1–3 connected to a wire that is propagating a signal, as the signal begins to transition, the circuit does not fight the transition because its main outputs (transistors 16 and 25) are in a high impedance state (they are shut down). Once the input switch point is reached (at either NAND gate 15 or NOR gate 24, depending on whether there is a rising or a falling transition), the appropriate output transistor (transistor 16 or 25, respectively) is turned on to assist the transition, and then turned off again. Circuits 10 and 35 maintain the current output state (high or low) to continue to help drive the wire.

Figure 6:
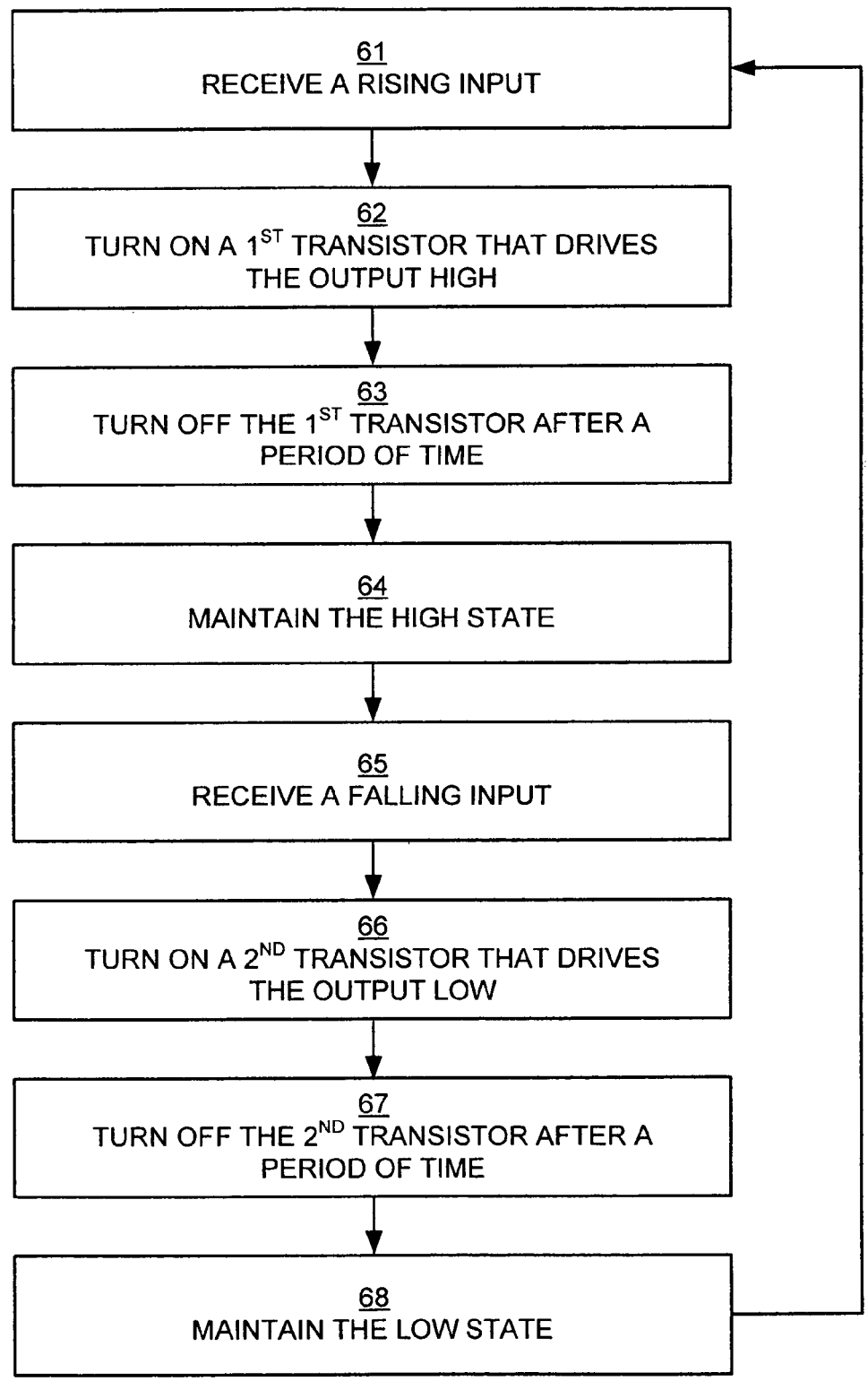
FIG. 6 is a flowchart of a method for assisting signal transitions in accordance with one embodiment of the present invention.

FIG. 6 is a flowchart 60 of a method for assisting signal transitions in accordance with one embodiment of the present invention. Although specific steps are disclosed in flowchart 60, such steps are exemplary. That is, embodiments of the present invention are well-suited to performing various other steps or variations of the steps recited in flowchart 60. It is appreciated that the steps in flowchart 60 may be performed in an order different than presented, and that not all of the steps in flowchart 60 may be performed.

In step 61 of FIG. 6, with reference also to FIGS. 1–3, a rising input is received at a circuit (e.g., circuits 10, 35 or 36). The rising input indicates that a signal on a wire coupled to the circuit is undergoing a rising transition. In one embodiment, the rising input is detected by an edge detector consisting of, at least in part, a logical gate (e.g., NAND gate 15).

In step 62, the rising input causes a first transistor (e.g., transistor 16) to turn on and drive the circuit output high. The circuit output, coupled to the wire, assists the wire signal's rising transition.

In step 63, the first transistor is turned off after a period of time. In one embodiment, the period of time is established by a delay chain coupled to the first transistor. With the first transistor turned off, the circuit will not resist a subsequent (e.g., falling) transition.

In step 64, in one embodiment, after the first transistor is turned off, the high output state is maintained by a keeper circuit. With the output connected to the wire, maintaining the high output state helps to drive the wire signal (which is also high). However, the keeper circuit is relatively weak and so also will not resist a subsequent transition.

In step 65, a falling input is received at the circuit. The falling input indicates that a signal on the wire coupled to the circuit is undergoing a falling transition. In one embodiment, the falling input is detected by an edge detector consisting of, at least in part, a logical gate (e.g., NOR gate 24).

In step 66, the falling input causes a second transistor (e.g., transistor 25) to turn on and drive the circuit output low. The circuit output, coupled to the wire, assists the wire signal's falling transition.

In step 67, the second transistor is turned off after a period of time. In one embodiment, the period of time is established by a delay chain coupled to the second transistor. With the second transistor turned off, the circuit will not resist a subsequent (e.g., rising) transition.

In step 68, in one embodiment, after the second transistor is turned off, the low output state is maintained by the keeper circuit. With the output connected to the wire, maintaining the low output state helps to drive the wire signal (which is also low). However, as mentioned above, the keeper circuit is relatively weak and so also will not resist a subsequent transition.

Figure 7:
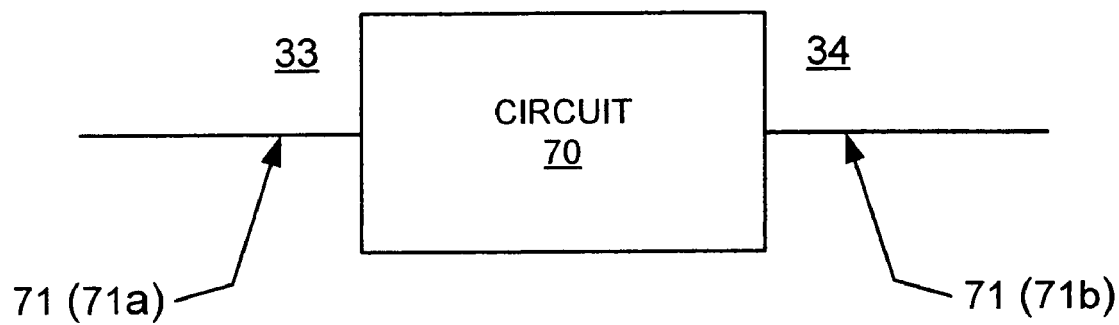
FIG. 7 is a block diagram illustrating a circuit coupled to a wire according to one embodiment of the present invention.

FIG. 7 illustrates a circuit 70 such as circuit 10, 35 or 36 of FIGS. 1–3, respectively, coupled to a wire 71 in a "feed through" fashion according to one embodiment of the present invention. In the example of FIG. 7, the wire 71 actually consists of a first portion (71a) and a second portion (71b). A signal on wire 71 enters circuit 70 at input 33 and exits at output 34. According to embodiments of the present invention, circuit 70 acts as a wire repeater/accelerator to assist a rising or falling signal transition on the wire 71, as described above. In various embodiments, a signal on the wire 71 is also driven by the circuit 70 as described above.

Figure 8:
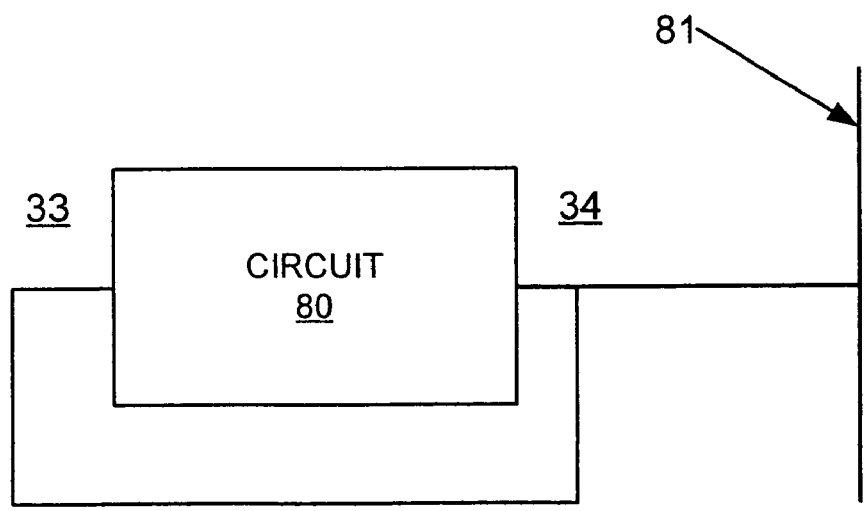
FIG. 8 is a block diagram illustrating a circuit coupled to a wire according to another embodiment of the present invention.

FIG. 8 illustrates a circuit 80 such as circuits 10, 35 or 36 of FIGS. 1–3, respectively, coupled to a wire 81 in a "lookaside" fashion according to one embodiment of the present invention. A signal on wire 81 enters circuit 80 at input 33 and exits at output 34. According to embodiments of the present invention, circuit 80 acts as a wire repeater/accelerator to assist a rising or falling signal transition on the wire 81, as described above. In various embodiments, a signal on the wire 81 is also driven by the circuit 80 as described above.

In summary, embodiments of the present invention provide circuits (e.g., wire accelerators and repeaters), and methods thereof, for assisting signal transitions on a wire (such as a wire on a chip). Circuit embodiments in accordance with the present invention can both drive a signal on the wire and assist during wire transitions, without resisting the transitions.

Embodiments in accordance with the present invention are thus described. While the present invention has been described in particular embodiments, it should be appreciated that the present invention should not be construed as limited by such embodiments, but rather construed according to the below claims.

What is claimed is:

1. A circuit for assisting signal transitions on a wire, said circuit comprising:
    first circuitry coupled to said wire downstream of the input to said circuit, said first circuitry causing a first transistor to turn on in response to a rising transition of a signal on said wire and then turn off after a first period of time, said first transistor driving the output of said circuit to a high state to assist in said rising transition; and
    second circuitry coupled to said wire downstream of said input, said second circuitry for maintaining said high state at said output from after said rising transition until a falling transition after said first transistor turns off, said second circuitry also for resetting said first circuitry in response to a falling transition of a signal on said wire.

2. The circuit of claim 1 wherein said input of said circuit is connected to said output and wherein said input and output are coupled to said wire in a lookaside configuration.

3. The circuit of claim 1 wherein said first circuitry comprises:
    a NAND gate coupled to said wire; and
    a delay chain coupled to said NAND gate.

4. The circuit of claim 1 wherein said first transistor is a p-type device.

5. The circuit of claim 1 further comprising third circuitry coupled to said wire, said third circuitry causing a second transistor to turn on in response to said falling transition and then turn off after a second period of time, said second transistor driving said output to a low state to assist in said falling transition.

6. The circuit of claim 5 wherein said second circuitry is also for maintaining said low state between said falling transition and a next rising transition.

7. The circuit of claim 6 wherein said second circuitry comprises a plurality of gates.

8. The circuit of claim 5 wherein said third circuitry comprises:
    a NOR gate coupled to said wire; and
    a delay chain coupled to said NOR gate.

9. The circuit of claim 5 wherein said second transistor is an n-type device.

10. The circuit of claim 1 wherein said first circuitry comprises:
    a NAND gate coupled to said first transistor and
    a latch element coupled to said NAND gate, wherein said NAND gate falls in response to said rising transition then rises after said first period of time, wherein the rise of said NAND gate releases said latch element so that said latch element can be reset by said falling transition.

11. A circuit for assisting signal transitions on a wire, said circuit comprising:
    first circuitry coupled to said wire downstream of the input to said circuit, said first circuitry causing a first transistor to turn on in response to a falling transition of a signal on said wire and then turn off after a first period of time, said first transistor driving the output of said circuit to a low state to assist in said falling transition; and
    second circuitry coupled to said wire downstream of said input, said second circuitry for maintaining said low state at said output from after said falling transition until a rising transition after said first transistor turns off, said second circuitry also for resetting said first circuitry in response to a rising transition of a signal on said wire.

12. The circuit of claim 11 further comprising third circuitry coupled to said wire, said third circuitry causing a second transistor to turn on in response to said rising transition and then turn off after a second period of time, said second transistor driving said output to a high state to assist in said rising transition.

13. The circuit of claim 12 wherein said third circuitry comprises:
    a NAND gate coupled to said wire; and
    a delay chain coupled to said NAND gate.

14. The circuit of claim 12 wherein said second transistor is a p-type device.

15. The circuit of claim 12 wherein said second circuitry is also for maintaining said high state between said rising transition and a next falling transition.

16. The circuit of claim 15 wherein siad second circuitry comprises a plurality of gates.

17. The circuit of claim 11 wherein said input of said circuit is connected to said output and wherein said input and output are coupled to said wire in a lookaside configuration.

18. The circuit of claim 11 wherein said third circuitry comprises:
  a NOR gate coupled to said wire; and
  a delay chain coupled to said NOR gate.

19. The circuit of claim 11 wherein said first transistor is an n-type device.

20. The circuit of claim 11 wherein said first circuitry comprises:
  a NOR gate coupled to said first transistor; and
  a latch element coupled to said NOR gate, wherein said NOR gate rises in response to said falling transition then falls after said first period of time, wherein the fall of said NOR gate releases said latch element so that said latch element can be reset by said rising transition.

* * * * *